(12) United States Patent
Park

(10) Patent No.: US 8,963,815 B2
(45) Date of Patent: Feb. 24, 2015

(54) ORGANIC LIGHT-EMITTING DISPLAY DEVICE

(75) Inventor: Chan-Young Park, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 639 days.

(21) Appl. No.: 13/137,766

(22) Filed: Sep. 12, 2011

(65) Prior Publication Data

US 2012/0280894 A1  Nov. 8, 2012

(30) Foreign Application Priority Data

May 3, 2011 (KR) .................. 10-2011-0041989

(51) Int. Cl.
G09G 3/30 (2006.01)
H01L 51/52 (2006.01)
H01L 27/32 (2006.01)

(52) U.S. Cl.
CPC .......... *H01L 51/5281* (2013.01); *H01L 27/326* (2013.01)
USPC ............................................................ 345/77

(58) Field of Classification Search
CPC .................... H01L 27/326; H01L 51/5281
USPC ............................................ 345/76–77
See application file for complete search history.

(56) References Cited

U.S. PATENT DOCUMENTS

| 7,268,488 | B2 | 9/2007 | Ryu |
| 2003/0052869 | A1 | 3/2003 | Fujii et al. |
| 2007/0024187 | A1 | 2/2007 | Shin et al. |
| 2007/0194702 | A1 | 8/2007 | Jeng et al. |
| 2008/0258614 | A1* | 10/2008 | Ha et al. ................ 313/504 |
| 2010/0033087 | A1* | 2/2010 | Kim et al. .............. 313/504 |
| 2010/0128205 | A1 | 5/2010 | Rho et al. |
| 2010/0320494 | A1 | 12/2010 | Kim et al. |
| 2011/0002039 | A1* | 1/2011 | Seo et al. ............... 359/487 |
| 2011/0114957 | A1* | 5/2011 | Kim et al. ............... 257/59 |
| 2011/0163661 | A1* | 7/2011 | Lee et al. ............... 313/504 |
| 2011/0175097 | A1 | 7/2011 | Song et al. |
| 2011/0220922 | A1 | 9/2011 | Kim et al. |

FOREIGN PATENT DOCUMENTS

| EP | 2278622 A2 | 1/2011 |
| EP | 2278622 A3 | 4/2014 |

(Continued)

OTHER PUBLICATIONS

European Search Report dated Jun. 17, 2014 for co-pending EP 11194694.3 (PARK).

*Primary Examiner* — Quan-Zhen Wang
*Assistant Examiner* — Tony Davis
(74) *Attorney, Agent, or Firm* — Lee & Morse, P.C.

(57) ABSTRACT

An organic light-emitting display device including: pixels on a first surface of a substrate, each pixel having a first region and a second region; pixel circuit units in the first region, each pixel circuit unit including at least one TFT; a first insulation film covering the pixel circuit units; first electrodes on the first insulation film, each first electrode being independently disposed in the first region and electrically connected to each pixel circuit unit; a second insulation film covering at least part of the first electrodes; a second electrode facing the first electrodes, the second electrode being electrically connected throughout the pixels and formed in at least the first region; an organic film between the first electrodes and the second electrode; a sealing member facing the first surface of the substrate; and a reflection preventing film on a second surface of the substrate.

22 Claims, 8 Drawing Sheets

(56) References Cited

FOREIGN PATENT DOCUMENTS

| KR | 10 2007-0014494 A | 2/2007 |
| KR | 10 2009-0122138 A | 11/2009 |
| KR | 10 2010-0060207 A | 6/2010 |
| KR | 10 2011-0085780 A | 7/2011 |
| KR | 10 2011-0103735 A | 9/2011 |

* cited by examiner

ORGANIC LIGHT-EMITTING DISPLAY DEVICE

CROSS-REFERENCE TO RELATED PATENT APPLICATION

This application claims the benefit of Korean Patent Application No. 10-2011-0041989, filed on May 3, 2011, in the Korean Intellectual Property Office, the disclosure of which is incorporated herein in its entirety by reference.

BACKGROUND

1. Field

Embodiments relates to an organic light-emitting display device. More particularly, embodiments relate to a transparent organic light-emitting display device.

2. Description of the Related Art

An organic light-emitting display device has excellent characteristics in terms of viewing angle, contrast, response speed, and power consumption. Thus, organic light-emitting display devices are widely used in personal portable devices, i.e., MP3 players or mobile phones, and televisions (TVs).

SUMMARY

According to an embodiment, there may be an organic light-emitting display device including: a substrate; a plurality of pixels on a first surface of the substrate, each pixel having a first region emitting light toward the substrate and a second region allowing an external light to penetrate therethrough; a plurality of pixel circuit units in the first region of each pixel, each pixel circuit unit including at least one thin film transistor (TFT); a first insulation film covering the pixel circuit units; a plurality of first electrodes formed on the first insulation film, each first electrode of the first electrodes independently disposed in the first region of each pixel and electrically connected to each pixel circuit unit; a second insulation film covering at least part of the first electrodes; a second electrode facing the plurality of first electrodes, the second electrode being electrically connected throughout the pixels and formed in at least the first region of each pixel; an organic film between the first electrodes and the second electrode; a sealing member facing the first surface of the substrate; and a reflection preventing film on a second surface of the substrate, wherein the reflection preventing film includes a reflection preventer corresponding to the first region and a transparent unit corresponding to the second region.

The reflection preventer may include a linear polarization film and a phase converting film.

The reflection preventer may include a circular polarization film.

The transparent unit may include any one of a linear polarization film and a phase converting film.

The transparent unit may have a hole.

The second electrode may be a light reflecting electrode.

The first region of each pixel may include a light-emitting region and a circuit region, the pixel circuit units may be disposed in the circuit region, the first electrodes may be disposed in the light-emitting region, and the light-emitting region and the circuit region of each pixel may be adjacent to each other.

The second region of at least two adjacent pixels may be independent from each other, and the transparent unit may be independent from another adjacent transparent unit.

The second region of at least two adjacent pixels may be connected to each other, and the transparent unit may be connected to another adjacent transparent unit.

The second electrode may include a plurality of first penetrating windows respectively at locations corresponding to the second regions.

The second insulation film may include a plurality of second penetrating windows connected to the plurality of first penetrating windows.

According to another embodiment, there may be an organic light-emitting display device including: a substrate; a plurality of pixels on a first surface of the substrate, each pixel of the pixels having a first region emitting light in a direction opposite to the substrate and a second region allowing an external light to penetrate therethrough; a plurality of pixel circuit units in the first region of each pixel, each pixel circuit unit including at least one TFT; a first insulation film covering the pixel circuit units; a plurality of first electrodes on the first insulation film, each first electrode of the first electrodes being independently disposed in the first region of each pixel and electrically connected to each pixel circuit unit; a second insulation film covering at least part of the first electrodes; a second electrode facing the plurality of first electrodes, the second electrode being electrically connected throughout the pixels and formed in at least the first region of each pixel; an organic film between the first electrodes and the second electrode; a sealing member facing the first surface of the substrate; and a reflection preventing film on a second surface of the substrate, wherein the reflection preventing film includes a reflection preventer corresponding to the first region and a transparent unit corresponding to the second region.

The reflection preventer may include a linear polarization film and a phase converting film.

The reflection preventer may include a circular polarization film.

The transparent unit may include any one of a linear polarization film and a phase converting film.

The transparent unit may have a hole.

Each first electrode may be a light reflecting electrode.

The first region of each pixel may include a light-emitting region and a circuit region, the pixel circuit units may be disposed in the circuit region, the first electrodes may be disposed in the light-emitting region, and the light-emitting region may overlap and cover the circuit region.

The second region of at least two adjacent pixels may be independent from each other, and the transparent unit may be independent from another adjacent transparent unit.

The second region of at least two adjacent pixels may be connected to each other, and the transparent unit may be connected to another adjacent transparent unit.

The second electrode may include a plurality of first penetrating windows respectively at locations corresponding to the second regions.

The second insulation film may include a plurality of second penetrating windows connected to the plurality of first penetrating windows.

BRIEF DESCRIPTION OF THE DRAWINGS

The above and other features will become more apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein.

While such terms as "first," "second," etc., may be used to describe various components, such components must not be limited to the above terms. The above terms are used only to distinguish one component from another.

The terms used in the present specification are merely used to describe particular embodiments, and are not intended to limit embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, embodiments will be described more fully with reference to the accompanying drawings, in which exemplary embodiments are shown.

Figure 1:
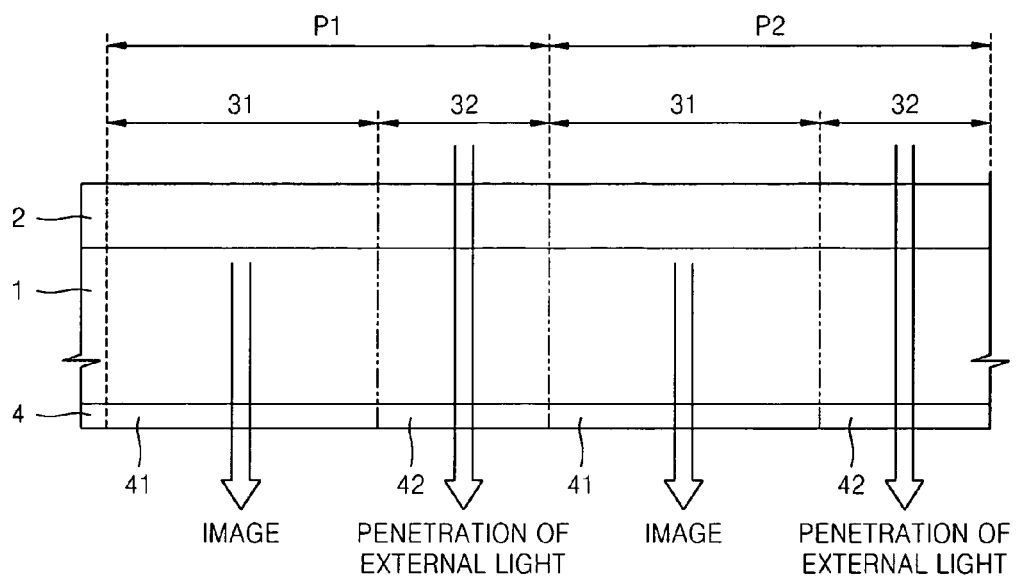
FIG. 1 is a schematic cross-sectional view of an organic light-emitting display device according to an embodiment.

FIG. 1 is a schematic cross-sectional view of an organic light-emitting display device according to an embodiment.

Referring to FIG. 1, the organic light-emitting display device includes an organic light-emitter (not shown) on a substrate 1, and a sealing substrate 2 covering the organic light-emitter. Meanwhile, the organic light-emitting display device also includes a reflection preventing film 4 on an outer surface of the substrate 1 where an image is realized.

In the organic light-emitting display device, an external light penetrates through the substrate 1, the organic light-emitter, and the sealing substrate 2.

Figure 2:
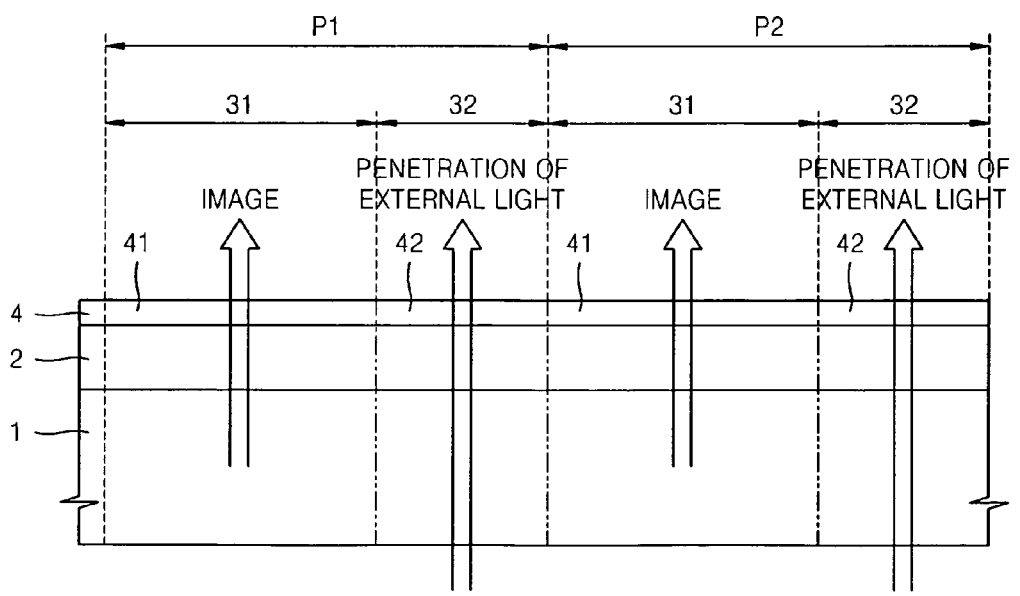
FIG. 2 is a schematic cross-sectional view of an organic light-emitting display device according to another embodiment.

Also, as will be described later, the organic light-emitter and the sealing substrate 2 are configured such that the external light penetrates through them, and as shown in FIG. 1, a user located at a side where the image is realized may be able to view an image of an upper external side of the substrate 1. The organic light-emitting display device of FIG. 1 is a bottom-emission type, wherein the image is realized toward the substrate 1. Alternatively, as shown in FIG. 2, the organic light-emitting display device may be a top-emission type, wherein the image is realized in an opposite direction of the substrate 1. As shown in FIG. 2, the user may view the image on the substrate 1, or at a bottom external side. However, the type of the organic light-emitting display device is not limited thereto. The organic light-emitting display device may be a dual-emission type, wherein the image is realized toward and in an opposite direction of the substrate 1.

FIGS. 1 and 2 shows a first pixel P1 and a second pixel P2, which are two adjacent pixels of the organic light-emitting display device.

Each of the first and second pixels P1 and P2 includes a first region 31 and a second region 32.

The image is realized through the first region 31, and the external light penetrates through the second region 32.

In other words, both the first and second pixels P1 and P2 include the first region 31 that realizes the image and the second region 32 through which the external light penetrates. Thus, the user may view an external scene when not viewing the image realized by the organic light-emitting display device.

Here, devices, i.e., a thin film transistor (TFT), a capacitor, and an organic light-emitting device, are not formed in the second region 32 so as to maximize external light transmittance in the second region 32. Thus, external light transmittance is increased in the organic light-emitting display device. Also, distortion of a penetrated image due to the devices, i.e., the TFT, the capacitor, and the organic light-emitting device, may be reduced.

Figure 3:
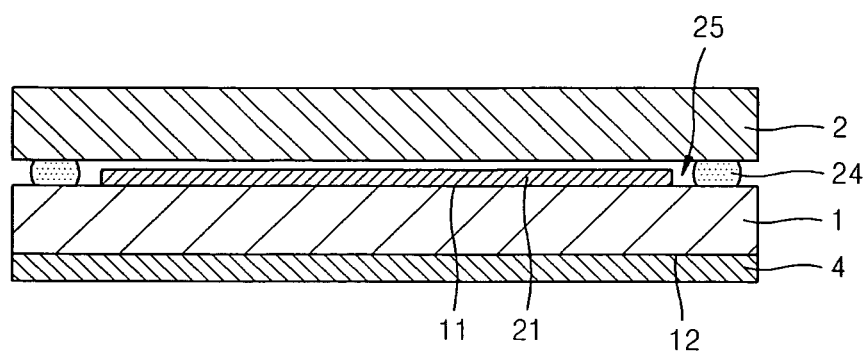
FIG. 3 is a cross-sectional view illustrating in detail the organic light-emitting display device of FIG. 1 or 2, according to an embodiment.

FIG. 3 is a cross-sectional view illustrating in detail the organic light-emitting display device of FIG. 1 or 2, according to an embodiment. Referring to FIG. 3, the organic light-emitting display device further includes an organic light-emitter 21 formed on a first surface 11 of the substrate 1, the sealing substrate 2 sealing the organic light-emitter 21, and a sealing material 24 for combining the substrate 1 and the sealing substrate 2.

The sealing substrate 2 is formed of a transparent material so that the image is realized from the organic light-emitter. The sealing substrate 2 prevents any external air or moisture from penetrating into the organic light-emitter.

Boundaries of the substrate 1 and the sealing substrate 2 are combined by the sealing material 24. Thus, a space 25 between the substrate 1 and the sealing substrate 2 are sealed. A moisture absorbent or a filling material may be disposed in the space 25.

Figure 4:
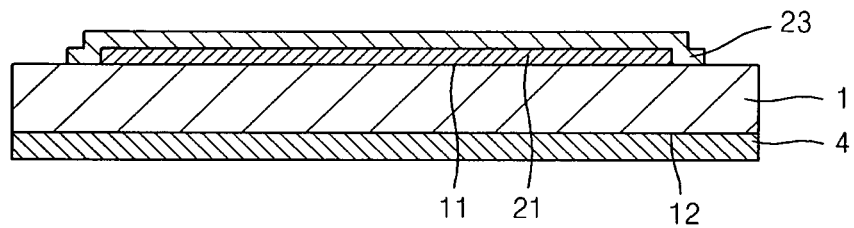
FIG. 4 is a cross-sectional view illustrating in detail the organic light-emitting display device of FIG. 1 or 2, according to another embodiment.

As shown in FIG. 4, a sealing film 23, instead of the sealing substrate 2, may be formed on the organic light-emitter 21 so as to protect the organic light-emitter 21 from external air. The sealing film 23 may have a structure in which a film formed of an inorganic material, i.e., a silicon oxide or a silicon nitride, and a film formed of an organic material, i.e., epoxy or polyimide, are alternately stacked on each other. However, the structure of the sealing film 23 is not limited thereto, and may have any sealing structure formed of a transparent thin film.

Although not shown, the sealing substrate 2 of FIG. 3 may be formed on the sealing film 23 of FIG. 4.

Meanwhile, FIGS. 3 and 4 illustrate in detail the organic light-emitting display device of FIG. 1, according to embodiments. Since the organic light-emitting display device of FIG. 1 realized the image toward the bottom of the substrate 1, the reflection preventing film 4 for preventing reflection of the external light is formed on the bottom, i.e., a second surface 12, of the substrate 1. Alternatively, although not illustrated in FIGS. 3 and 4, since the organic light-emitting display device of FIG. 2 realizes the image in the opposite direction of the substrate 1, the reflection preventing film 4 for preventing the reflection of the external light is formed on an external surface of the sealing substrate 2 or the sealing film 23.

In the organic light-emitting display device, the external light transmittance in the second region 32 is maximized to increase external light transmittance in the organic light-emitting display device. Also, the reflection preventing film 4 is disposed on the first region 31 to prevent the reflection of the external light, thereby increasing contrast of the organic light-emitting display device and displaying a clear image.

As will be described later in detail with reference to FIGS. 8 and 11, a pixel circuit unit including at least one TFT is disposed in the first region 31. Also, an organic light-emitting device including a first electrode and a second electrode is disposed in the first region 31. A structure such as the pixel circuit unit or the organic light-emitting device including the first and second electrodes reflects the external light, thereby causing contrast of the organic light-emitting display device to deteriorate. Specifically, one of the first and second electrodes operates as a reflection electrode to realize bottom emission or top emission. Thus, the contrast of the organic light-emitting display device is further deteriorated since the first or second electrode reflects the external light. Accordingly, a portion corresponding to the first region 31 needs to have a structure for removing the reflection of the external light. Meanwhile, the second region 32 may not include an insulation film, an electrode, or an optical film so as to increase the external light transmittance.

Accordingly, the reflection preventing film 4 is used to reduce reflectivity of the external light in the first region 31 and increase the external light transmittance in the second region 32. In detail, the reflection preventing film 4 includes a reflection preventer 41 for reducing the reflectivity of the external light in a portion corresponding to the first region 31, and a transparent unit 42 for increasing the external light transmittance in a portion corresponding to the second region 32.

The reflection preventer 41 includes a circular polarization film, or a film in which a linear polarization film and a phase converting film are stacked on each other. Here, the external light is converted to a circular light having a predetermined rotating direction as it passes through the circular polarization film. Alternatively, the external light is converted to a linear light having a predetermined direction as it passes through the linear polarization film, and a phase of the linear light is changed by ¼ of a wavelength as the linear light passes through the phase converting film. Thus, the linear light is converted to a circular light having a predetermined rotating direction. Here, the phase converting film may be a Lamda/4 retarder. Accordingly, the film in which the linear polarization film and the phase converting film are stacked on each other may have the same functions as the circular polarization film.

Meanwhile, the reflection preventing film 4 may have a film shape or may be formed by directly molding a linear structure on a coated thin film. For example, the circular polarization film, the linear polarization film, and the phase converting film may be films adhered to the reflection preventer 41. However, the reflection preventer 41 is not limited thereto. The phase converting film of the reflection preventer 41 may be configured to change a phase by forming a multi-layer of organic or inorganic thin films and then adjusting a thickness of the organic or inorganic thin films. Here, the linear polarization film of the reflection preventer 41 may be formed on the phase converting film by periodically disposing a metallic linear structure having a nano-size.

Figure 5A:
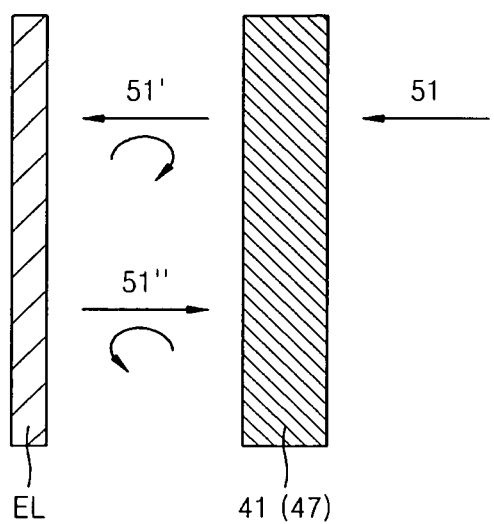
FIGS. 5A and 5B are conceptual diagrams for describing a principle of preventing reflection of an external light by a reflection preventer.
Figure 5B:
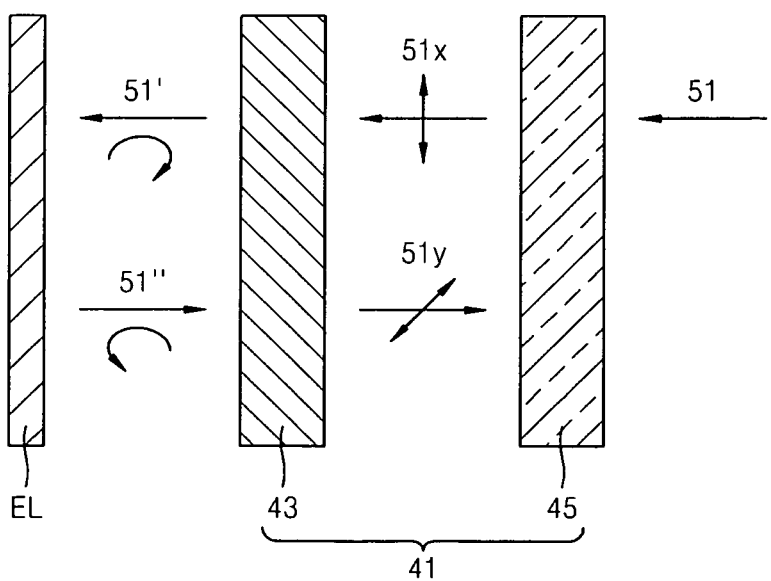

FIGS. 5A and 5B are conceptual diagrams for describing a principle of preventing the reflection of the external light by the reflection preventer 41.

The principle of preventing the reflection of the external light by the reflection preventer 41 including the circular polarization film 47 will now be described with reference to FIG. 5A.

An external light 51 is converted to a first circular light 51' rotating in a predetermined direction, by passing through the reflection preventer 41. The first circular light 51' is reflected at a first electrode or a second electrode, which reflects a light and is included in an organic light-emitting device EL disposed in the first region 31. Here, when the organic light-emitting display device is a bottom emission type, the second electrode may be a light reflecting electrode, and when the organic light-emitting display device is a top emission type, the first electrode may be a light reflecting electrode. Here, the reflected first circular light 51' is converted to a second circular light 51'' as a rotating direction of the first circular light 51' changes to an opposite direction. For example, when the first circular light 51' is a right circular light in a clockwise rotation, the second circular light 51'' is a left circular light in a counterclockwise rotation. Since the rotating direction of the second circular light 51'' is opposite, the second circular light 51'' cannot pass through the reflection preventer 41 including the circular polarization film 47 again. As a result, the external light 51 is not reflected and disappears. Thus, an image reflected from the first region 31 of the organic light-emitting display device is clearly displayed without deterioration of contrast due to the reflection of the external light 51.

The principle of preventing the reflection of the external light by the reflection preventer including a film in which a linear polarization film 45 and a phase converting film 43 are stacked on each other will be described with reference to FIG. 5B. Here, the phase converting film 43 may be disposed closer to the organic light-emitting device EL, and the linear polarization film 45 may be stacked on an external surface of the phase converting film 43.

The external light 51 is converted to a first linear light 51x, which vibrates in a predetermined axis direction, by passing through the linear polarization film 45. Then, a phase of the first linear light 51x is changed by ¼ of a wavelength by the phase converting film 43. Thus, the first linear light 51x is converted to the first circular light 51' rotating in a predetermined rotating direction. The first circular light 51' is reflected at a first electrode or a second electrode, which reflects a light and is included in the organic light-emitting device EL disposed in the first region 31. Here, the reflected first circular light 51' is converted to the second circular light 51'' as a rotating direction of the first circular light 51' changes to an opposite direction. The second circular light 51'' again passes through the phase converting film 43 and thus is converted into a second linear light 51y. The second linear light 51y has a perpendicular component of the first linear light 51x. Accordingly, the second linear light 51y cannot pass through the linear polarization film 45 again. As a result, the external light 51 is not reflected and disappears. Thus, an image reflected from the first region 31 of the organic light-emitting display device is clearly displayed without deterioration of contrast due to the reflection of the external light 51.

Meanwhile, unlike the reflection preventer 41, the transparent unit 42 may include any one of the linear polarization film 45 and the phase converting film 43, or may not include any optical film and have a hole corresponding to the second region 32. Since the transparent unit 42 penetrates through the external light without a polarization function, the external light transmittance of the organic light-emitting display device is improved. Meanwhile, it may be better to form a hole through the transparent unit 42, since the linear polarization film 45 or the phase converting film 43 may partially absorb or allow the external light to only partially penetrate therethrough.

The transparent unit 42 may be formed by making the hole at a portion corresponding to the second region 32 of the pixel in the reflection preventing film 4. Such a hole may be formed by pressing the reflection preventing film 4 by using a mold including a minute blade. Alternatively, the hole may be formed by applying heat to a part of the reflection preventing film 4 by using a minute laser beam.

Next, the organic light-emitter 21 according to embodiments will be described.

Figure 6:
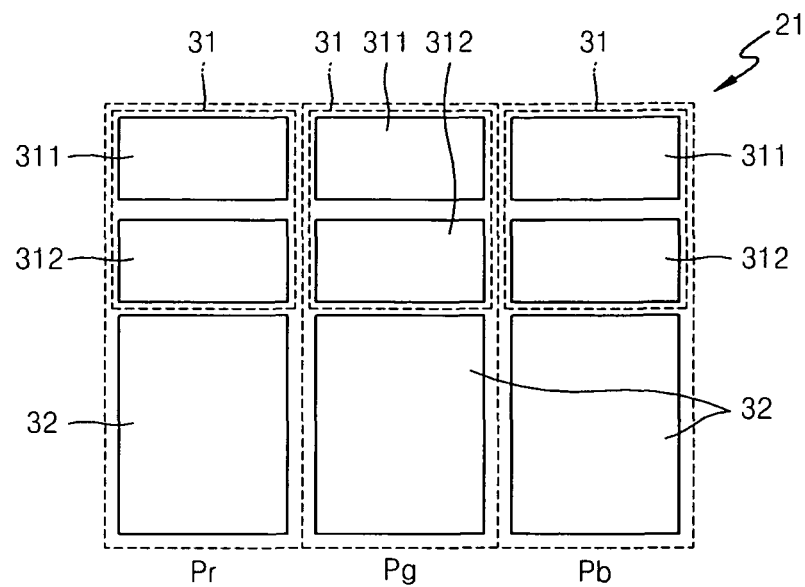
FIG. 6 is a schematic plan view of an organic light-emitter of FIG. 3 or 4, according to an embodiment.

FIG. 6 is a schematic plan view of a red pixel Pr, a green pixel Pg, and a blue pixel Pb of the organic light-emitter 21, according to an embodiment.

Each of the red pixel Pr, green pixel Pg, and blue pixel Pb includes a circuit region 311 and a light-emitting region 312 in the first region 31. The circuit region 311 and the light-emitting region 312 are adjacently disposed.

Also, the second region 32 penetrating through the external light is adjacently disposed to the first region 31.

Figure 7:
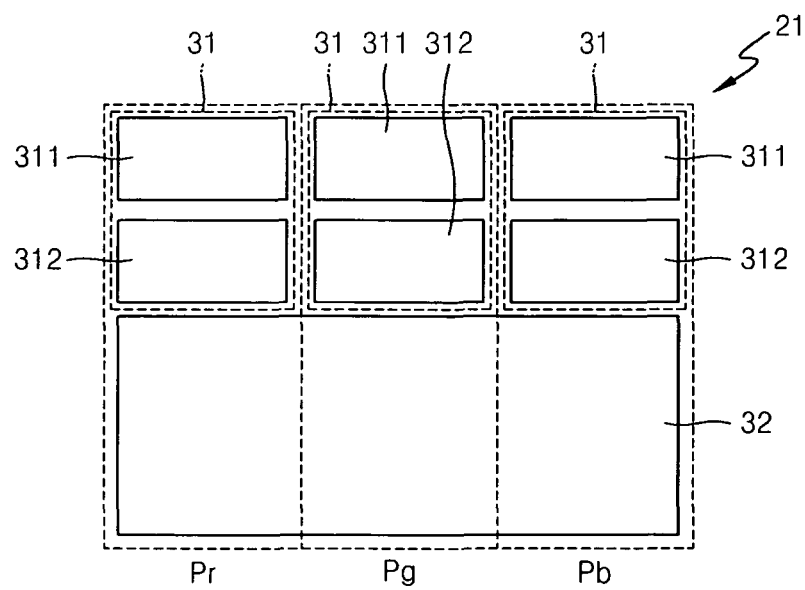
FIG. 7 is a schematic plan view of the organic light-emitter of FIG. 3 or 4, according to another embodiment.

The second regions 32 may be independently disposed according to the red, green, and blue pixels Pr, Pg, and Pb as shown in FIG. 6, or connected to each other throughout the red, green, and blue pixels Pr, Pg, and Pb. Referring to FIG. 7, an area of the second region 32 the external light to penetrate therethrough is large. Thus, transmittance of the organic light-emitting display device may be increased. Meanwhile, in FIG. 6, wires (data wires and power supply wires) pass through a space between the independent second regions 32, but in FIG. 7, the second regions 32 are connected to each other. Thus, the wires (data wires and power supply wires) are disposed at both outer sides of a penetration region. In other words, the wires (data wires and power supply wires) are not disposed to cross the second region 32.

In FIG. 7, the red, green, and blue pixels Pr, Pg, and Pb are connected to each other throughout the second region 32, but positions of the red, green, and blue pixels Pr, Pg, and Pb are not limited thereto. Any two adjacent pixels of the red, green, and blue pixels Pr, Pg, and Pb may be connected in the second regions 32.

Figure 8:
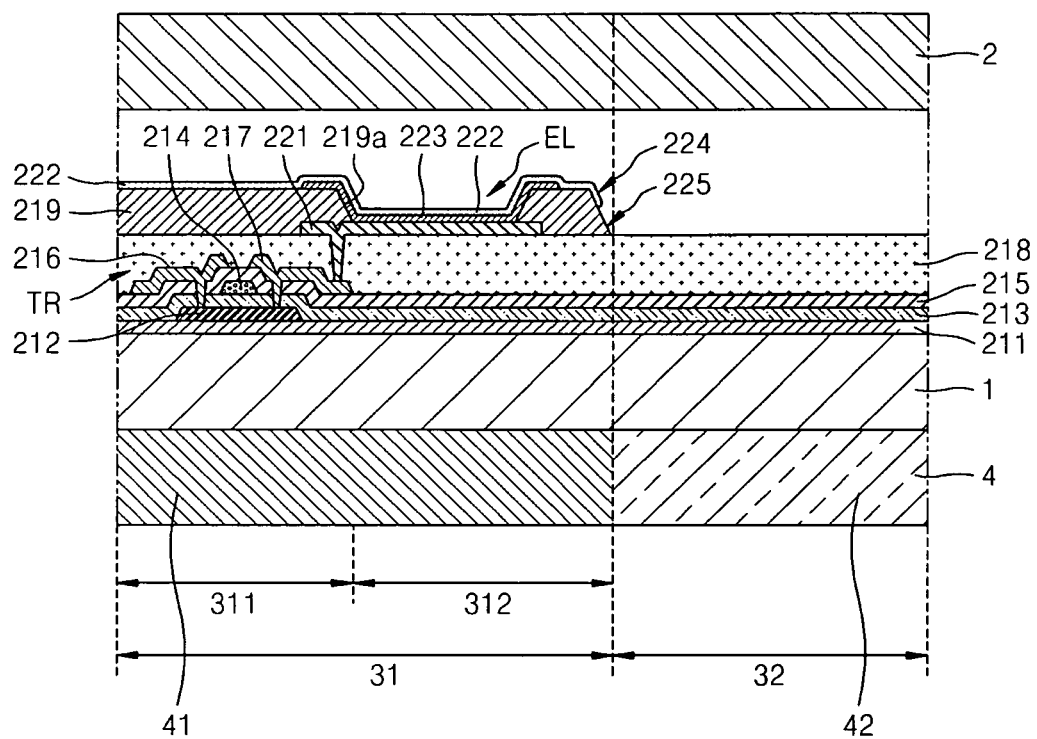
FIG. 8 is a cross-sectional view of a pixel of the organic light-emitter of FIG. 3 or 4, according to an embodiment.

FIG. 8 is a cross-sectional view of any one of the red, green, and blue pixels Pr, Pg, and Pb of FIG. 6 or 7, according to an embodiment.

As shown in FIG. 8, the a TFT TR is disposed in the circuit region 311, but instead of just one TFT TR, a pixel circuit unit PC including the TFT TR may be disposed in the circuit region 311. The pixel circuit unit PC may further include a plurality of other TFTs, aside from the TFT TR, a storage capacitor, and wires, i.e., a scan line, a data line, and a Vdd line, which are connected to the TFTs and the storage capacitor.

The organic light-emitting device EL constituting a light-emitting device is disposed in the light-emitting region 312. The organic light-emitting device EL is electrically connected to the TFT TR of the pixel circuit unit PC.

A buffer film 211 is formed on the substrate 1, and the pixel circuit unit PC including the TFT TR is formed on the buffer film 211.

First, a semiconductor active layer 212 is formed on the buffer film 211.

The buffer film 211 is formed of any transparent insulating material, which prevents penetration of an impure element and smoothens a surface of the buffer film 21. For example, the buffer film 211 may be formed of an inorganic material, i.e., a silicon oxide, a silicon nitride, a silicon oxynitride, an aluminum oxide, an aluminum nitride, a titanium oxide, or a titanium nitride, an organic material, i.e., polyimide, polyester, acryl, or a stacked structure of the inorganic material and the organic material. The buffer film 211 is not an essential element, and thus may not be included.

The semiconductor active layer 212 may be formed of polycrystalline silicon, but is not limited thereto, and may be formed of an oxide semiconductor. For example, the semiconductor active layer 212 may be a G-I-Z-O layer [(In2O3)a(Ga2O3)b(ZnO)c layer], wherein a, b, and c are each a real number satisfying a≥0, b≥0, c>0. When the semiconductor active layer 212 is formed of an oxide semiconductor, light transmittance of the circuit region 311 of the first region 31 may be increased. Thus, external light transmittance of the organic light-emitting display device may be increased.

A gate insulation film 213, which is formed of a transparent insulating material, is formed on the buffer film 211 to cover the semiconductor active layer 212, and a gate electrode 214 is formed on the gate insulation film 213.

An interlayer insulation film 215, which is formed of a transparent insulating material, is formed on the gate insulation film 213 to cover the gate electrode 214, and a source electrode 216 and a drain electrode 217 are formed on the interlayer insulation film 215, each contacting the semiconductor active layer 212 via a contact hole.

The structure of the TFT TR is not limited thereto, and may vary.

A passivation film 218 is formed to cover the pixel circuit unit PC including the TFT TR. The passivation film 218 may be a single or plurality of insulation films, wherein a top surface is even. The passivation film 218 may be formed of a transparent inorganic insulating material and/or organic insulating material. The passivation film 218 may be formed throughout all pixels.

As shown in FIG. 7, a first electrode 221 of the organic light-emitting device EL electrically connected to the TFT TR is formed on the passivation film 218. The first electrode 221 is formed in an individual and independent island form according to pixels.

A pixel definition film 219 formed of an organic and/or inorganic insulating material is formed on the passivation film 218. The pixel definition film 219 covers a boundary and exposes a center of the first electrode 221. The pixel definition film 219 may cover the first region 31. In this case, the pixel definition film 219 may cover only a part of the first electrode 221, specifically the boundary of the first electrode 221, and not the entire first region 31.

An organic film 223 and a second electrode 222 are sequentially stacked on the first electrode 221. The second electrode 222 covers the organic film 223 and the pixel definition film 219 constituting an insulating film, and is electrically connected throughout all pixels.

The organic film 223 may be a low molecular or high molecular organic film. The low molecular organic film may have a single or complex structure, in which a hole injection layer (HIL), a hole transport layer (HTL), an emission layer (EML), an electron transport layer (ETL), and an electron injection layer (EIL) are stacked on each other, and may be formed of an organic material, i.e., copper phthalocyanine (CuPc), N,N'-Di(naphthalene-1-yl)-N,N'-diphenyl-benzidine (NPB), or tris-8-hydroxyquinoline aluminum (Alq3). The low molecular organic film may be formed by using a vacuum deposition method. Here, the HIL, the HTL, the ETL, and the EIL are common layers and may be commonly applied to red, green, and blue pixels.

The first electrode 221 operates as an anode and the second electrode 222 operates as a cathode. Alternatively, polarities of the first and second electrodes 221 and 222 may be changed.

According to an embodiment, the first electrode 221 may be a transparent electrode and the second electrode 222 may be a reflective electrode. The first electrode 221 may be formed of indium tin oxide (ITO), an indium zinc oxide (IZO), zinc oxide (ZnO), or indium oxide (In2O3), which have a high work function. Also, the second electrode 222 may be formed of a metal having a low work function, i.e., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Accordingly, the organic light-emitting device EL is a bottom emission type for realizing an image in a direction of the first electrode 221.

Alternatively, the second electrode 222 may also be a transparent electrode.

As described above, the passivation film 218, the gate insulation film 213, the interlayer insulation film 215, and the pixel definition film 219 may each be a transparent insulation film so as to increase external light transmittance.

The sealing substrate 2 may be disposed above the second electrode 222. As shown in FIG. 3, the boundary of the sealing substrate 2 is combined with the substrate 1 by using the separate sealing material 24, so as to seal the organic light-emitter 21 from external air. A separate filling material (not shown) or a moisture absorbent may be disposed in a space between the sealing substrate 2 and the second electrode 222. However, a sealing structure of the organic light-emitter 21 is not limited to using the sealing substrate 2 of FIG. 8. The sealing film 23 of FIG. 4 may be alternatively used.

Meanwhile, the second electrode 222 and the pixel definition film 219 may respectively include a first penetrating window 224 and a second penetrating window 225. The first penetrating window 224 may be formed by removing a portion of the second electrode 222, which corresponds to the second region 32. The second penetrating window 225 may be formed by removing a portion of the pixel definition film 219, which corresponds to the second region 32. The first and second penetrating windows 224 and 225 may be connected to each other.

The second penetrating window 225 may be further formed in at least one of the passivation film 218, the interlayer insulation film 215, the gate insulation film 213, and the buffer film 211.

However, the first and second penetrating windows 224 and 225 do not have to exist together, and any one of the first and second penetrating windows 224 and 225 may be formed. Here, only the first penetrating window 224 may be formed on the second electrode 222 formed of a metal, so as to increase external light transmittance.

Figure 9:
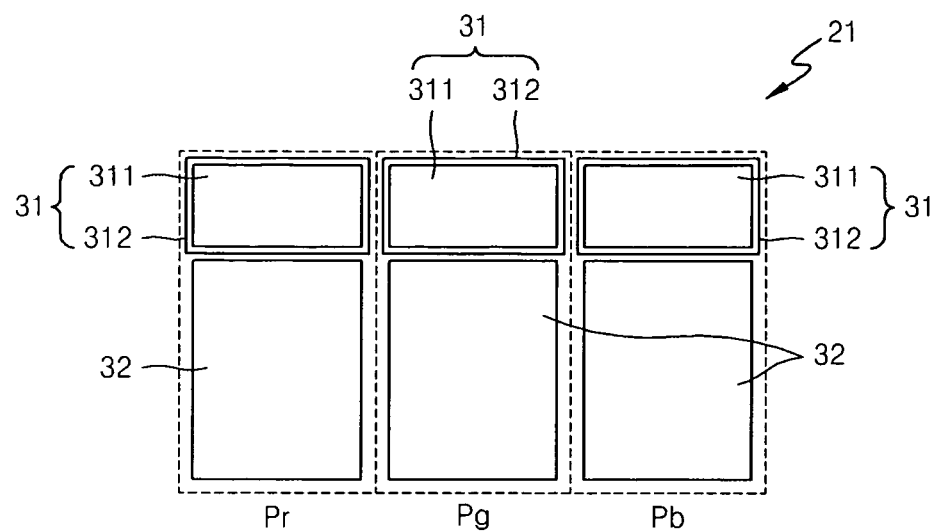
FIG. 9 is a cross-sectional view of the pixel of the organic light-emitter of FIG. 3 or 4, according to another embodiment.

FIG. 9 is a cross-sectional view of the adjacent red, green, and blue pixels Pr, Pg, and Pb of the organic light-emitter 21 according to another embodiment.

The circuit region 311 and the light-emitting region 312 are included in the first region 31 of each of the red, green, and blue pixels Pr, Pg, and Pb, wherein the circuit region 311 and the light-emitting region 312 overlap each other. As shown in FIG. 9, an area of the light-emitting region 312 is larger than an area of the pixel circuit unit PC of the circuit region 311. Thus, the pixel circuit unit PC of the circuit region 311 is completely covered by the light-emitting region 312.

Figure 10:
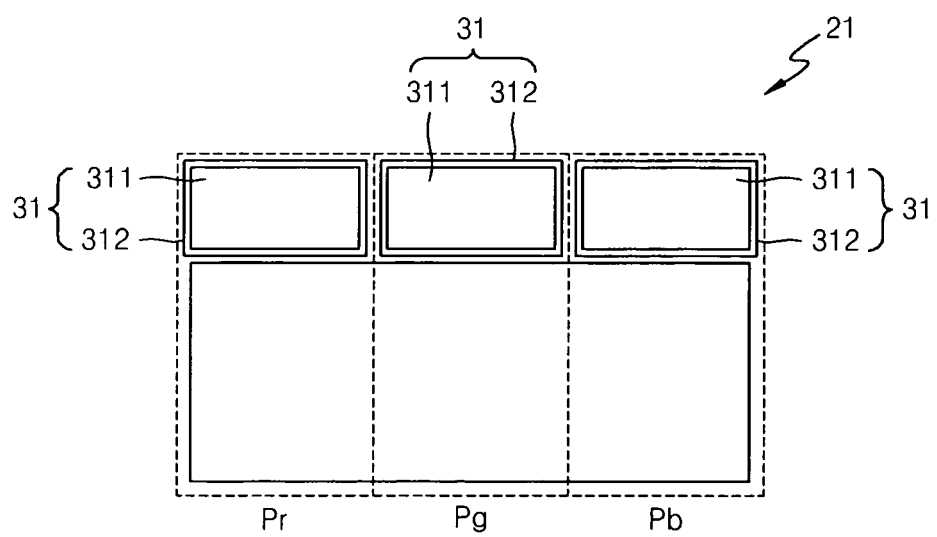
FIG. 10 is a schematic plan view of the organic light-emitter of FIG. 3 or 4, according to another embodiment.

The second region 32 allowing the external light to penetrate therethrough is disposed adjacent to the first region 31. As shown in FIG. 9, the second region 32 may be independently included according to the red, green, and blue pixels Pr, Pg, and Pb. Alternatively, as shown in FIG. 10, the second region 32 may be connectively formed throughout the red, green, and blue pixels Pr, Pg, and Pb. In FIG. 10, since the area of the second region 32 through which the external light penetrates is large, transmittance of the organic light-emitting display device may be increased.

Figure 11:
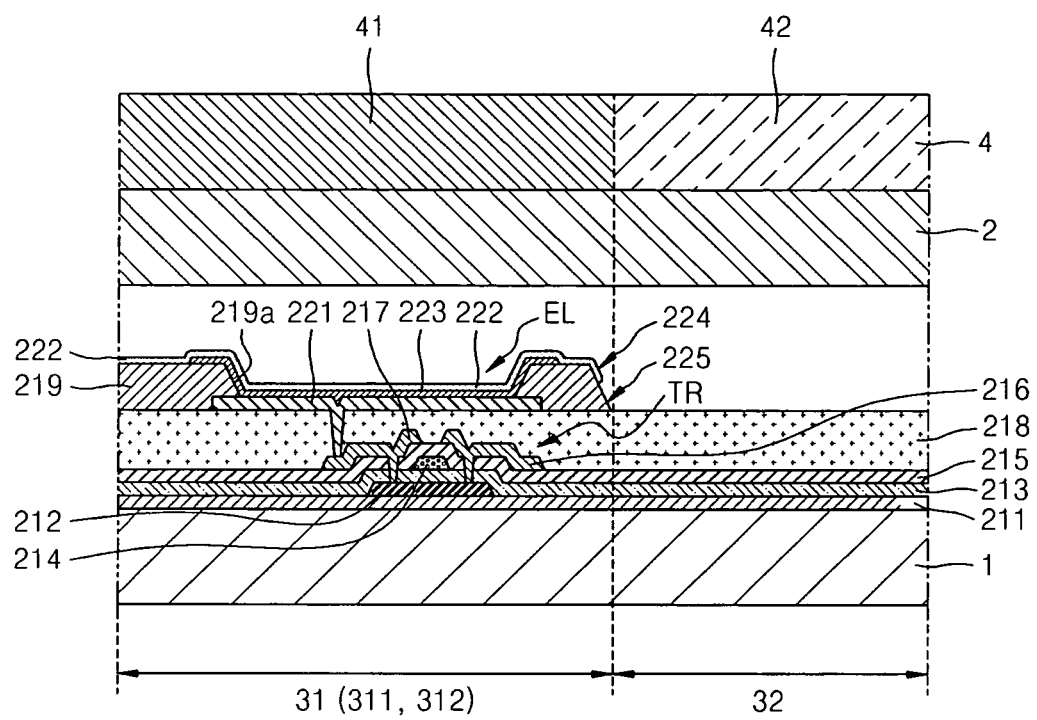
FIG. 11 is a cross-sectional view of a pixel of the organic light-emitter of FIG. 3 or 4, according to another embodiment.

FIG. 11 is a cross-sectional view of any one of the red, green, and blue pixels Pr, Pg, and Pb of FIG. 9 or 10.

As shown in FIG. 11, the TFT TR is disposed in the circuit region 311, but instead of just one TFT TR, the pixel circuit unit PC including the TFT TR may be disposed in the circuit region 311. The pixel circuit unit PC may further include a plurality of other TFTs, aside from the TFT TR, a storage capacitor, and wires, i.e., a scan line, a data line, and a Vdd line, which are connected to the TFTs and the storage capacitor.

Meanwhile, the organic light-emitting device EL constituting a light emitting device is disposed in the light-emitting region 312, which is formed to cover the circuit region 311 by overlapping with the circuit region 311. The organic light-emitting device EL is electrically connected to the TFT TR of the pixel circuit unit PC.

The buffer film 211 is formed on the substrate 1, and the pixel circuit unit PC including the TFT TR is formed on the buffer film 211.

First, the semiconductor active layer 212 is formed on the buffer film 211.

The semiconductor active layer 212 may be formed of polycrystalline silicon, but is not limited thereto, and may be formed of an oxide semiconductor. For example, the semiconductor active layer 212 may be a G-I-Z-O layer [(In2O3)a(Ga2O3)b(ZnO)c layer], wherein a, b, and c are each a real number satisfying a≥0, b≥0, c>0.

The gate insulation film 213 formed of a transparent insulating material is formed on the buffer film 211 to cover the semiconductor active layer 212, and the gate electrode 214 is formed on the gate insulation film 213.

The interlayer insulation film 214 formed of a transparent insulating material is formed on the gate insulation film 213 to cover the gate electrode 214, and the source electrode 216 and the drain electrode 217 are formed on the interlayer insulation film 215, wherein the source and drain electrodes 216 and 217 each contact the semiconductor active layer 212 through a contact hole.

However, the structure of the TFT TR is not limited thereto, and may vary.

The passivation film 218 is formed to cover the pixel circuit unit PC including the TFT TR. The passivation film 218 may be a single or plurality of insulation films having a flat top. The passivation film 218 may be formed of a transparent inorganic insulating material and/or organic insulating material. The passivation film 218 may be connectively formed throughout all pixels.

As shown in FIG. 11, the first electrode 221 of the organic light-emitting device EL is formed on the passivation film 218 to cover the TFT TR. The first electrode 221 is formed in an individual and independent island form according to pixels.

The pixel definition film 219 formed of an organic and/or inorganic insulating material is formed on the passivation film 218.

The pixel definition film 219 covers the boundary and exposes the center of the first electrode 221. The pixel definition film 219 may cover the first region 31, and here, may cover only a part of the first electrode 221, specifically the boundary of the first electrode 221, and not the entire first region 31.

The organic film 223 and the second electrode 222 are sequentially stacked on the first electrode 221. The second electrode 222 covers the organic film 223 and the pixel definition film 219 constituting an insulation film, and is electrically connected throughout all pixels. The second electrode 222 may be formed throughout the first and second regions 31 and 32.

The first electrode 221 operates as an anode and the second electrode 222 operates as a cathode, or alternatively, polarities of the first and second electrodes 221 and 222 may be changed.

The first electrode 221 has a size corresponding to the first region 31 according to pixels. The second electrode 222 may be a common electrode to cover all pixels of the organic light-emitter 21.

According to an embodiment, the first electrode 221 may be a reflective electrode and the second electrode 222 may be a transparent electrode. Accordingly, the organic light-emitter 21 is a top emission type realizing an image in a direction of the second electrode 222.

Accordingly, the first electrode 221 may include a reflective film formed of Ag, Mg, Al, Pt, Pd, Au, Ni, Nd, Ir, Cr, Li, Ca, or a compound thereof, and ITO, IZO, ZnO, or $In_2O_3$, which has a high work function. Meanwhile, the second electrode 222 may be formed of a metal having a low work function, i.e., Ag, Mg, Al, Pt, Pd, Au, Ni, Nd, Ir, Cr, Li, Ca, or an alloy thereof. The second electrode 222 may be formed as a thin film for high transmittance.

As such, when the first electrode 221 is a reflective electrode, the pixel circuit unit PC disposed below the first electrode 221 is covered by the first electrode 221. Thus, as shown in FIG. 11, a user at an upper outer side of the second electrode 222 is unable to view parts of the TFT TR, each pattern of a capacitor (not shown), the scan line, the data line, and the Vdd line, which are below the first electrode 221.

Since the first electrode 221 is the reflective electrode, an emitted light is only transmitted to the user, i.e., upward, and thus an amount of light lost in an opposite direction of the user may be reduced. Also, as described above, since the first electrode 221 covers various patterns of a pixel circuit therebelow, the user is able to clearly view therethrough.

As described above, the passivation film 218, the gate insulation film 213, the interlayer insulation film 215, and the pixel definition film 219 may be transparent insulation films to increase external light transmittance.

Meanwhile, the second electrode 222 and the pixel definition film 219 may respectively further include the first penetrating window 224 and the second penetrating window 225. The first penetrating window 224 may be formed by removing a portion of the second electrode 222 corresponding to the second region 32, and the second penetrating window 225 may be formed by removing a portion of the pixel definition film 219 corresponding to the second region 32. The first and second penetrating windows 224 and 225 may be connected to each other.

Alternatively, an opening or penetrating windows connected to the second penetrating window 225 formed on the pixel definition film 219 may be further formed on at least one of the passivation film 218, the interlayer insulation film 215, the gate insulation film 213, and the buffer film 211, so as to increase light transmittance of the second region 32.

Figure 12:
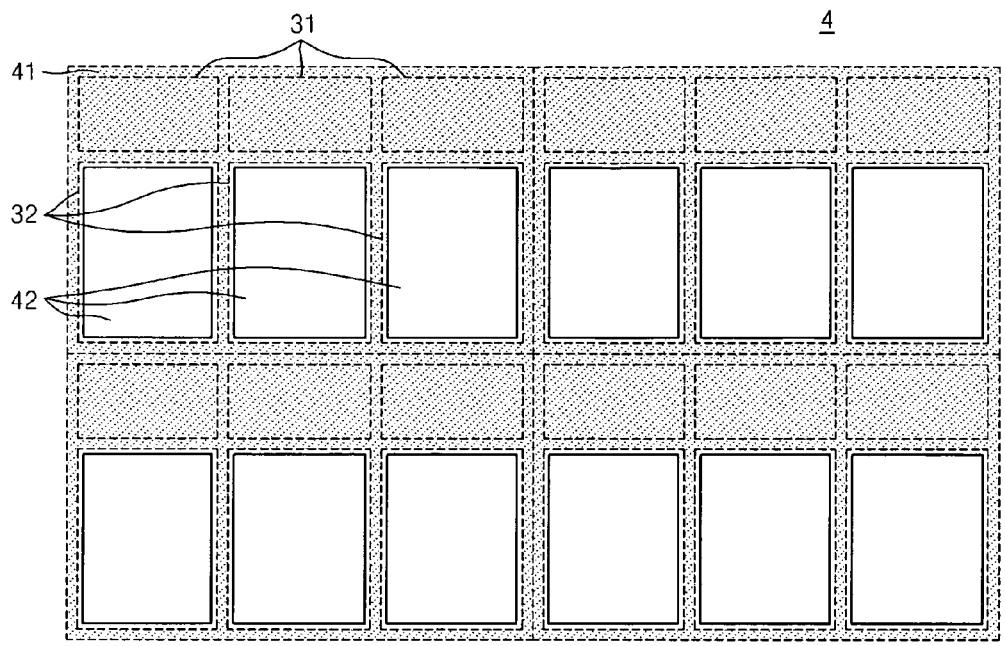
FIGS. 12 and 13 are plan views of reflection preventing films according to embodiments.
Figure 13:
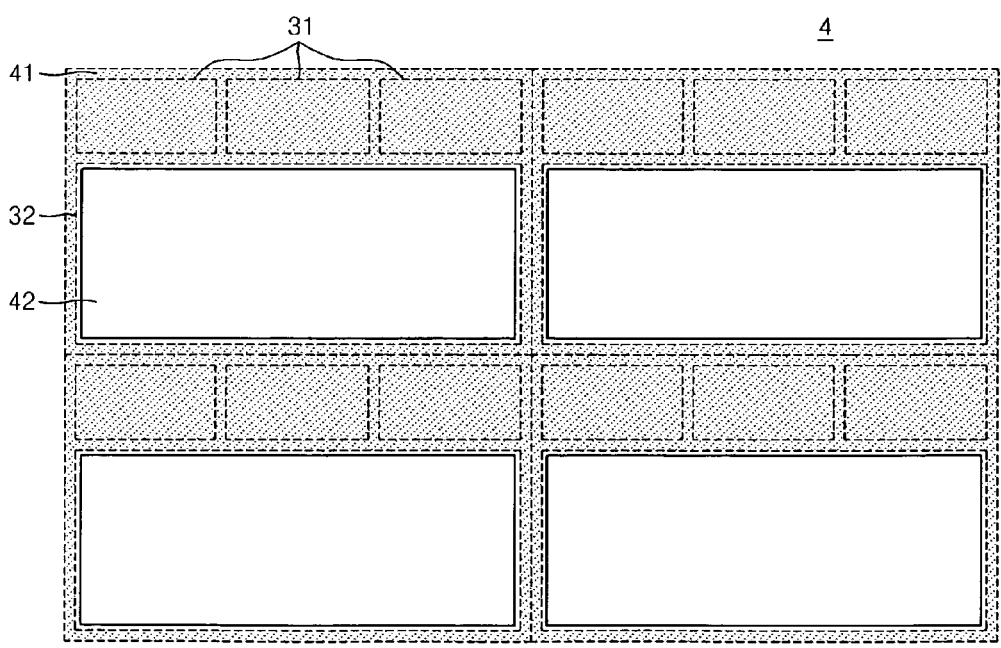

FIGS. 12 and 13 are plan views of reflection preventing films 4 according to embodiments.

FIG. 12 shows the reflection preventing film 4 included in the organic light-emitting display device, wherein the second region 32 is independently formed according to pixels, as in FIGS. 6 and 9. In FIG. 12, 4 pixel sets shown in FIGS. 6 and 9 are adhered to each other. Referring to FIG. 12, the transparent unit 42 is independently formed from another adjacent transparent unit 42 to correspond to the second region 32.

FIG. 13 shows the reflection preventing film 4 included in the organic light-emitting display device, wherein the second regions 32 of at least two adjacent pixels are connected to each other as in FIGS. 7 and 10. In FIG. 13, 4 pixel sets shown in FIGS. 7 and 10 are adhered to each other. Referring to FIG. 13, the transparent unit 42 is connected to another adjacent transparent unit 42 to correspond to the second region 32.

By way of summation and review, there have been attempts to manufacture a transparent organic light-emitting display device by disposing a transparent thin film transistor (TFT) or a transparent organic light-emitting device therein. An object or an image on the opposite side of the transparent organic light-emitting display device is seen by a user as light from the object or the image penetrating through the transparent organic light-emitting device, the transparent TFT, a pattern of several wires, and a space between the wires. However, transmittance of the transparent organic light-emitting device, the TFT, and the wires is not high. In addition, the space between the wires is very small. Thus, transmittance of the transparent organic light-emitting display device is not high.

In contrast, according to present embodiments, a user can view an image having high contrast by preventing reflection of external light from a reflective electrode. In addition, according to present embodiments, deterioration of external light transmittance can be reduced. Thus, the user can easily view the image.

Exemplary embodiments have been disclosed herein, and although specific terms are employed, they are used and are to be interpreted in a generic and descriptive sense only and not for purpose of limitation.

What is claimed is:
1. An organic light-emitting display device, comprising:
a substrate;
a plurality of pixels on a first surface of the substrate, each pixel of the plurality of pixels having a first region emitting light toward the substrate and a second region allowing an external light to penetrate therethrough;
a plurality of pixel circuit units in the first region of each pixel, each pixel circuit unit of the plurality of pixel circuit units including at least one thin film transistor (TFT);
a first insulation film covering the pixel circuit units;
a plurality of first electrodes on the first insulation film, each first electrode of the plurality of first electrodes being independently disposed in the first region of each pixel and electrically connected to each pixel circuit unit;
a second insulation film covering at least part of the first electrodes;
a second electrode facing the first electrodes, the second electrode being electrically connected throughout the pixels and formed in at least the first region of each pixel;
an organic film between the first electrodes and the second electrode;
a sealing member facing the first surface of the substrate; and
a reflection preventing film on a second surface of the substrate, wherein the reflection preventing film includes a reflection preventer coextensive with the first regions and a transparent unit coextensive with the second regions, wherein a polarization function of the reflection preventer is greater than that of the transparent unit.

2. The organic light-emitting display device as claimed in claim 1, wherein the reflection preventer includes a linear polarization film and a phase converting film.

3. The organic light-emitting display device as claimed in claim 1, wherein the reflection preventer includes a circular polarization film.

4. The organic light-emitting display device as claimed in claim 1, wherein the transparent unit includes any one of a linear polarization film and a phase converting film.

5. The organic light-emitting display device as claimed in claim 1, wherein the transparent unit has a hole coextensive with each second region, the second regions not containing any pixel circuits.

6. The organic light-emitting display device as claimed in claim 1, wherein the second electrode is a light reflecting electrode.

7. The organic light-emitting display device as claimed in claim 1, wherein the first region of each pixel includes a light-emitting region and a circuit region, the pixel circuit units are disposed in the circuit region, the first electrodes are disposed in the light-emitting region, and the light-emitting region and the circuit region of each pixel are adjacent to each other.

8. The organic light-emitting display device as claimed in claim 1, wherein the second region of one pixel is independent from the second region of an adjacent pixel, and the transparent unit is independent from another adjacent transparent unit.

9. The organic light-emitting display device as claimed in claim 1, wherein the second region of one pixel is connected to the second region of an adjacent pixel, and the transparent unit is connected to another adjacent transparent unit.

10. The organic light-emitting display device as claimed in claim 1, wherein the second electrode includes a plurality of first penetrating windows respectively at locations corresponding to the second regions.

11. The organic light-emitting display device as claimed in claim 10, wherein the second insulation film includes a plurality of second penetrating windows connected to the plurality of first penetrating windows.

12. An organic light-emitting display device, comprising:
a substrate;
a plurality of pixels on a first surface of the substrate, each pixel of the plurality of pixels having a first region emitting light in a direction opposite to the substrate and a second region allowing an external light to penetrate therethrough;
a plurality of pixel circuit units in the first region of each pixel, each pixel circuit unit of the plurality of pixel circuit units including at least one TFT;
a first insulation film covering the pixel circuit units;
a plurality of first electrodes on the first insulation film, each first electrode of the plurality of first electrodes being independently disposed in the first region of each pixel and electrically connected to each pixel circuit unit;
a second insulation film covering at least part of the first electrodes;
a second electrode facing the first electrodes, the second electrode being electrically connected throughout the pixels and formed in at least the first region of each pixel;
an organic film between the first electrodes and the second electrode;
a sealing member facing the first surface of the substrate; and
a reflection preventing film on the sealing member,
wherein the reflection preventing film includes a reflection preventer coextensive with the first regions and a transparent unit coextensive with the second regions, wherein a polarization function of the reflection preventer is greater than that of the transparent unit.

13. The organic light-emitting display device as claimed in claim 12, wherein the reflection preventer includes a linear polarization film and a phase converting film.

14. The organic light-emitting display device as claimed in claim 12, wherein the reflection preventer includes a circular polarization film.

15. The organic light-emitting display device as claimed in claim 12, wherein the transparent unit includes any one of a linear polarization film and a phase converting film.

16. The organic light-emitting display device as claimed in claim 12, wherein the transparent unit has a hole coextensive with each second region, the second regions not containing any pixel circuits.

17. The organic light-emitting display device as claimed in claim 12, wherein each first electrode is a light reflecting electrode.

18. The organic light-emitting display device of claim 12, wherein the first region of each pixel includes a light-emitting region and a circuit region, the pixel circuit units are disposed in the circuit region, the first electrodes are disposed in the light-emitting region, and the light-emitting region overlaps and covers the circuit region.

19. The organic light-emitting display device as claimed in claim 12, wherein the second region of at least two adjacent pixels are independent from each other, and the transparent unit is independent from another adjacent transparent unit.

20. The organic light-emitting display device as claimed in claim 12, wherein the second region of at least two adjacent pixels are connected to each other, and the transparent unit is connected to another adjacent transparent unit.

21. The organic light-emitting display device as claimed in claim 12, wherein the second electrode includes a plurality of first penetrating windows respectively at locations corresponding to the second regions.

22. The organic light-emitting display device as claimed in claim 21, wherein the second insulation film includes a plurality of second penetrating windows connected to the plurality of first penetrating windows.

* * * * *